(12) United States Patent
Ang et al.

(10) Patent No.: US 8,581,595 B2
(45) Date of Patent: Nov. 12, 2013

(54) METHOD OF MEASURING FLASH MEMORY CELL CURRENT

(75) Inventors: Boon-Aik Ang, Santa Clara, CA (US); Soo-yong Park, Sunnyvale, CA (US); Steve Choi, San Jose, CA (US)

(73) Assignee: Spansion LLC, Sunnyvale, CA (US)

( * ) Notice: Subject to any disclaimer, the term of this patent is extended or adjusted under 35 U.S.C. 154(b) by 571 days.

(21) Appl. No.: 12/228,691

(22) Filed: Aug. 15, 2008

(65) Prior Publication Data

US 2010/0039095 A1     Feb. 18, 2010

(51) Int. Cl.
     *G01R 31/08*      (2006.01)

(52) U.S. Cl.
     USPC ......................................................... 324/522

(58) Field of Classification Search
     USPC ...................... 324/76.11, 676–680; 365/185.01–185.33; 327/307; 330/9
     See application file for complete search history.

(56) References Cited

U.S. PATENT DOCUMENTS

| | | | | |
|---|---|---|---|---|
| 4,961,014 A | * | 10/1990 | Kasahara | ......................... 327/45 |
| 6,683,462 B2 | * | 1/2004 | Shimizu | ......................... 324/658 |
| 6,781,906 B2 | * | 8/2004 | Perner et al. | ................... 365/209 |
| 6,795,359 B1 | * | 9/2004 | Baker | ............................ 365/209 |
| 7,193,545 B2 | | 3/2007 | Morrow et al. | ................. 341/143 |
| 7,366,021 B2 | * | 4/2008 | Taylor et al. | .............. 365/185.21 |
| 7,864,609 B2 | * | 1/2011 | Porter et al. | ................... 365/207 |
| 2004/0049724 A1 | * | 3/2004 | Bill et al. | ........................ 714/733 |
| 2004/0088614 A1 | * | 5/2004 | Wu | .................................. 714/718 |
| 2008/0313510 A1 | * | 12/2008 | Baker | ............................ 714/718 |

OTHER PUBLICATIONS

Delta Sigma Modulation, available at http://en.wikipedia.org/wiki/Delta-sigma_modulation on Oct. 19, 2007.*

* cited by examiner

*Primary Examiner* — Melissa Koval
*Assistant Examiner* — Daniel Miller

(57) ABSTRACT

In the present method of measuring the current of a first current source, the current thereof may be combined with either the current of a second current source, or the current of a third current source. Based on a combination of the current of the first current source and either (a) the current of the second current source or (b) the current of the third current source, a digital output is provided. If this digital output is of a first value, the state of combining the current of the first current source with the current of the second current source becomes in effect. If this digital output is of a second value, the state of combining the current of the first current source with the current of the second current source becomes in effect.

14 Claims, 13 Drawing Sheets

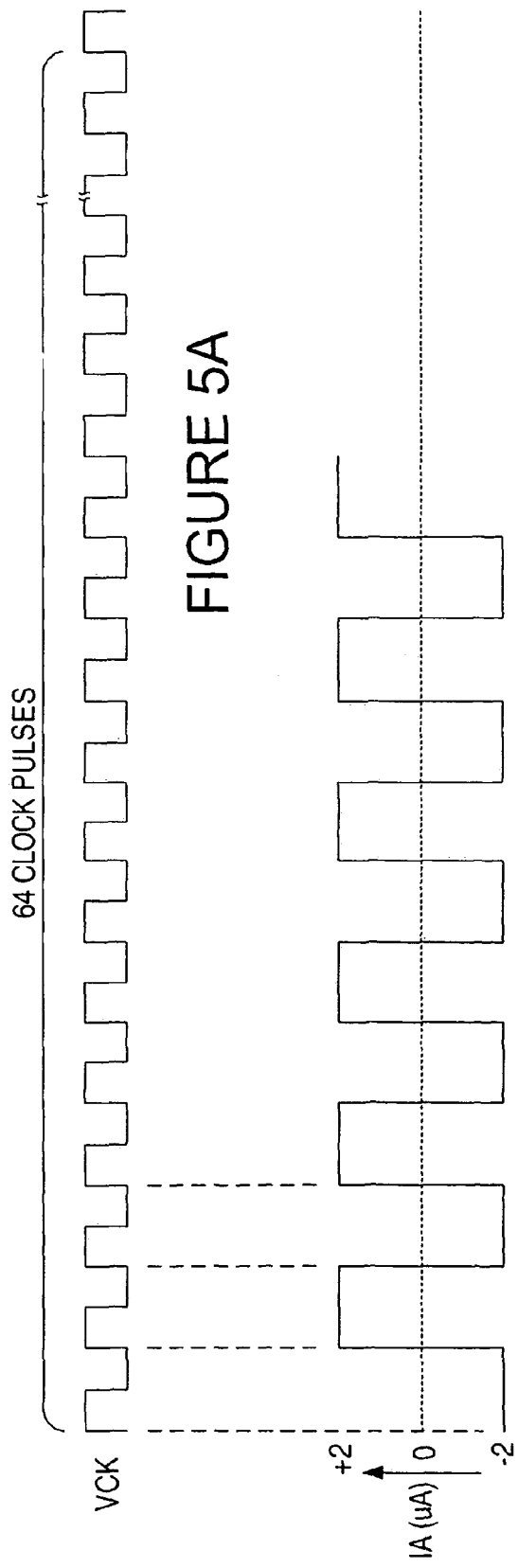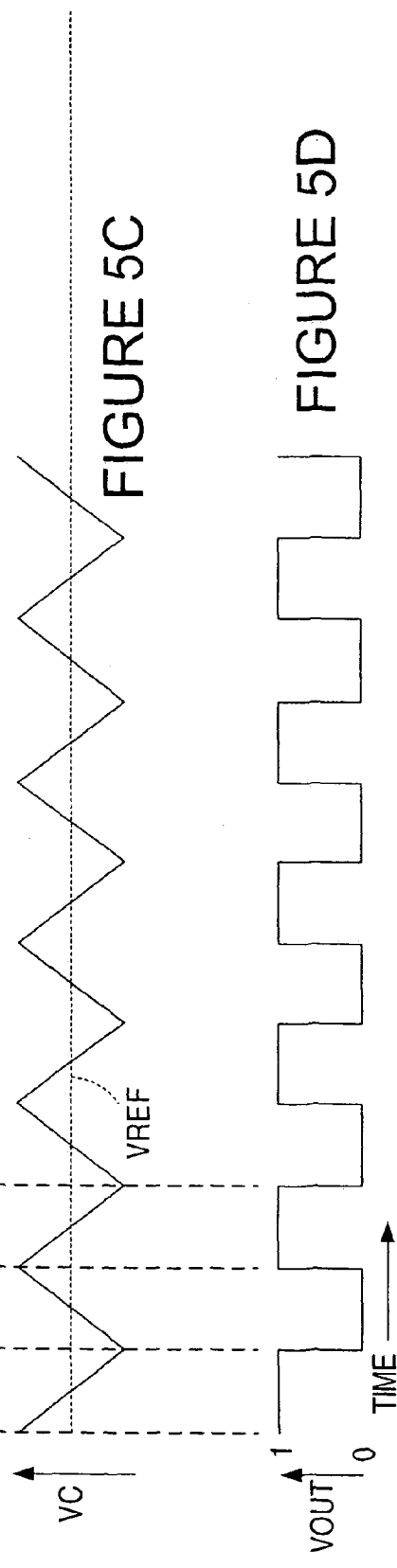

METHOD OF MEASURING FLASH MEMORY CELL CURRENT

BACKGROUND OF THE INVENTION

1. Field of the Invention

This invention relates generally to electronic memory, and more particularly, to a method of accurately measuring current in a flash memory cell.

2. Discussion of the Related Art

Recently, self-testing of flash memory cells on-chip (called Built-In-Self-Test, or BIST) has increased in the interest of reducing cost. Some critical BIST tests require accurate measurement of flash memory cell current. Once such current is known, the cell can be trimmed to establish a desired current level therethrough, so that that cell can be used as a reference cell in reading the states of flash memory cells in an array.

A previous approach has been to measure the flash memory cell current off-chip by sending that current to a tester with a Parametric Measurement Unit (PMU). While this approach provides an accurate reading of the current level, this approach is expensive in terms of hardware and tester time. Furthermore, during the current measurement process, the gate voltage of the transistor of the flash memory cell must be set at a known voltage, the best source of which is directly from the BIST. However, this applied gate voltage is subject to corruption by AC noise from the tester, resulting in error-prone current measurement of the cell.

Moving the current measurement on-chip can significantly save test time and cost. In a previous approach, an on-chip current comparator is used for comparing one-to-one the current to be measured with a known reference current. The most practical method of generating an accurate reference current is to pass current through a resistor external to the chip. However, in this situation, the gate voltage is subject to corruption by noise from power/ground bounce and noise injected from using such an external resistor. Furthermore, on-chip current measurement circuits are subject to imperfections in silicon which lead to device mismatches in the current comparator, which may result in error-prone current measurement.

Indeed, imperfections in silicon causing device mismatches commonly cause input offset error which, in generating reference current, may have that current to have less than desired accuracy.

Therefore, what is needed is an approach which overcomes the above problems by accurately measuring current in a flash memory cell and by providing proper DC offset cancellation.

SUMMARY OF THE INVENTION

Broadly stated, the present method of measuring the current of a first current source comprises (a) providing second and third current sources, (b) combining the current of the first current source with the current of the second current source, (c) applying the combined current of the first current source and second current source to provide voltage, (d) comparing the provided voltage with a reference voltage, (e) providing a digital output based on the comparison of the provided voltage with the reference voltage, (f) if the digital output is of a first value, again undertaking steps (b), (c), (d) and (e), (g) if the digital output is of a second value different from the first value, (h) combining the current of the first current source with the current of the third current source, (i) applying the combined current of the first current source and third current source to provide another voltage, (j) comparing said another provided voltage with the reference voltage, (k) providing a digital output based on the comparison of said another provided voltage with the reference voltage, (l) if the digital output is of the first value, again undertaking steps (b), (c), (d) and (e), and (m) if the digital output is of the second value different from the first value, again undertaking steps (h), (i), (j) and (k).

The present invention is better understood upon consideration of the detailed description below, in conjunction with the accompanying drawings. As will become readily apparent to those skilled in the art from the following description, there is shown and described an embodiment of this invention simply by way of the illustration of the best mode to carry out the invention. As will be realized, the invention is capable of other embodiments and its several details are capable of modifications and various obvious aspects, all without departing from the scope of the invention. Accordingly, the drawings and detailed description will be regarded as illustrative in nature and not as restrictive.

BRIEF DESCRIPTION OF THE DRAWINGS

The novel features believed characteristic of the invention are set forth in the appended claims. The invention itself, however, as well as said preferred mode of use, and further objects and advantages thereof, will best be understood by reference to the following detailed description of an illustrative embodiment when read in conjunction with the accompanying drawings, wherein:

FIG. 5 is a timing diagram illustrating the operation of the circuit of FIGS. 3 and 4 in measuring a first current level;

DETAILED DESCRIPTION

Reference is now made in detail to a specific embodiment of the present invention which illustrates the best mode presently contemplated by the inventors for practicing the invention.

Figure 1:
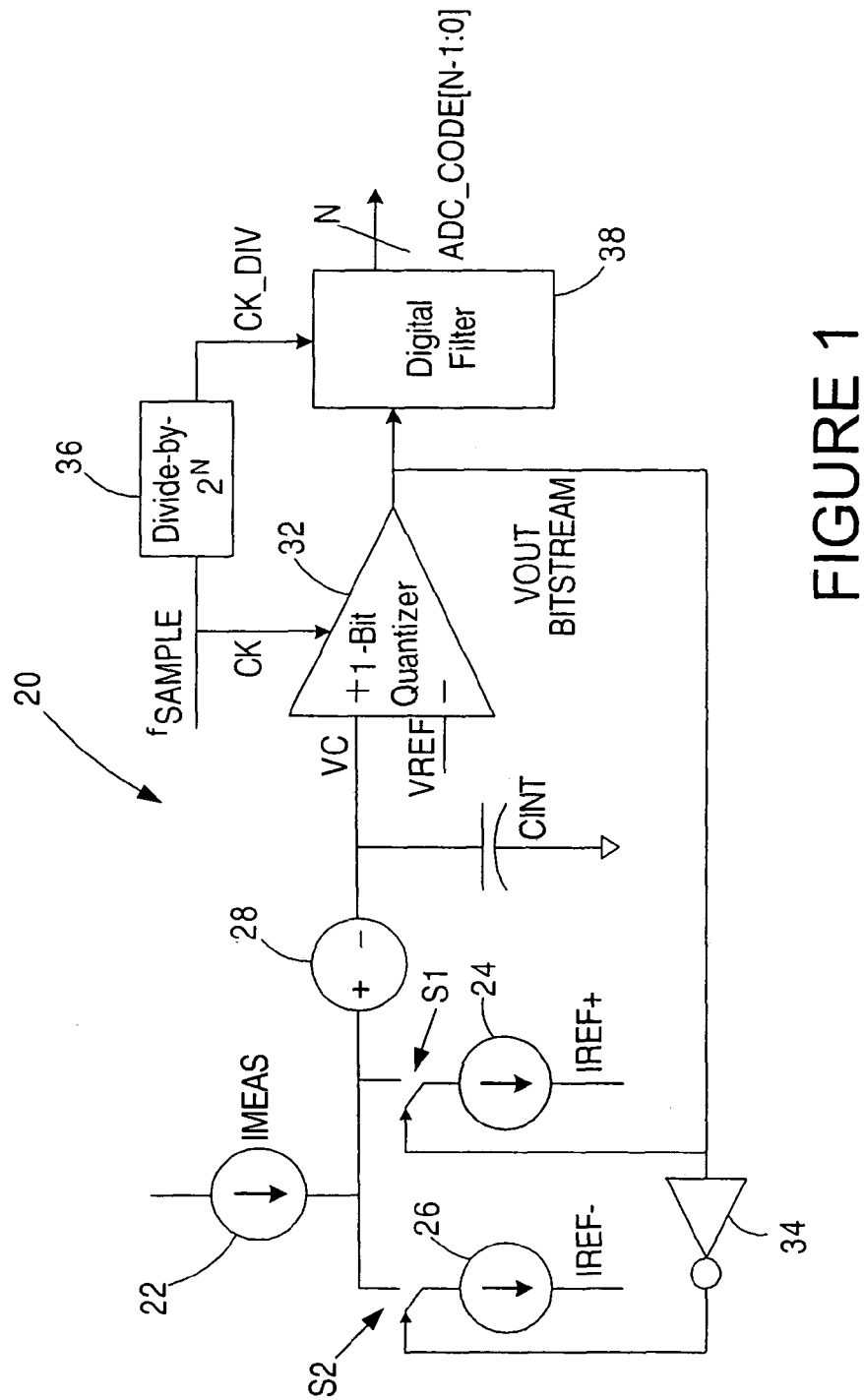
FIG. 1 is a schematic view of the present current measuring circuit.

FIG. 1 illustrates the on-chip circuit 20 for practicing the present invention. The circuit 20 includes a current source 22 consisting of a transistor of a flash memory cell, the current of which is to be measured as will be described further on. The current source 22 may be brought into series with either a current source 24 or a current source 26, by respective switches S1, S2. In this way, and as will be described further on, current of the current source 22 may be combined with current of the current source 24, or current of the current 22 may be combined with current of the current source 26. These combinations of current may be measured by ammeter 28 and applied to a capacitor CINT (acting as an integrator) to provide voltage VC on that capacitor CINT. The voltage VC on the capacitor CINT is applied to an input of a comparator/1-bit quantizer 32, and a reference voltage VREF is applied to the other input of the comparator/1-bit quantizer 32. When the voltage VC applied to the input of the comparator/1-bit quantizer 32 is lower than the reference voltage VREF, a digital voltage bit of value 0 is output from the comparator/1-bit quantizer 32, which 0 value is applied to switch to open the switch S1 so that the current source 24 is not connected to the current source 22. Meanwhile, the output 0 from the comparator/1-bit quantizer 32 is inverted by inverter 34 to a 1 value, which is applied to the switch S2 to close the switch S2 so that the current source 26 is connected to the current source 22.

Conversely, when the voltage VC applied to the comparator/1-bit quantizer 32 is higher than the reference voltage VREF, a digital voltage bit of value 1 is output from the comparator/1-bit quantizer 32, which 1 value is applied to switch S1 to close the switch S1 so that the current source 24 is connected to the current source 22. Meanwhile, the output 1 from the comparator/1-bit quantizer is inverted by inverter 34 to a 0 value, which is applied to the switch S2 to open the switch S2 so that the current source 26 is not connected to the current source 22.

The state of the output of the comparator/1-bit quantizer 32 is sampled at regular time intervals, i.e., at each pulse of a clock, until a full clock divide period is reached. In this embodiment, the full clock divide period is made up of $2^N$ clock cycles, where N=6, or $2^6$=64 clock cycles, measured by divider 36. In the meantime, the output of the comparator/1-bit quantizer 32 is also applied to a digital filter 38 which stores successive outputs, one for each clock pulse, so that during the full clock divide period, 64 successive bit values are stored. The filter 38 provides accurate signal information in ADC signal code output therefrom.

Figure 2:
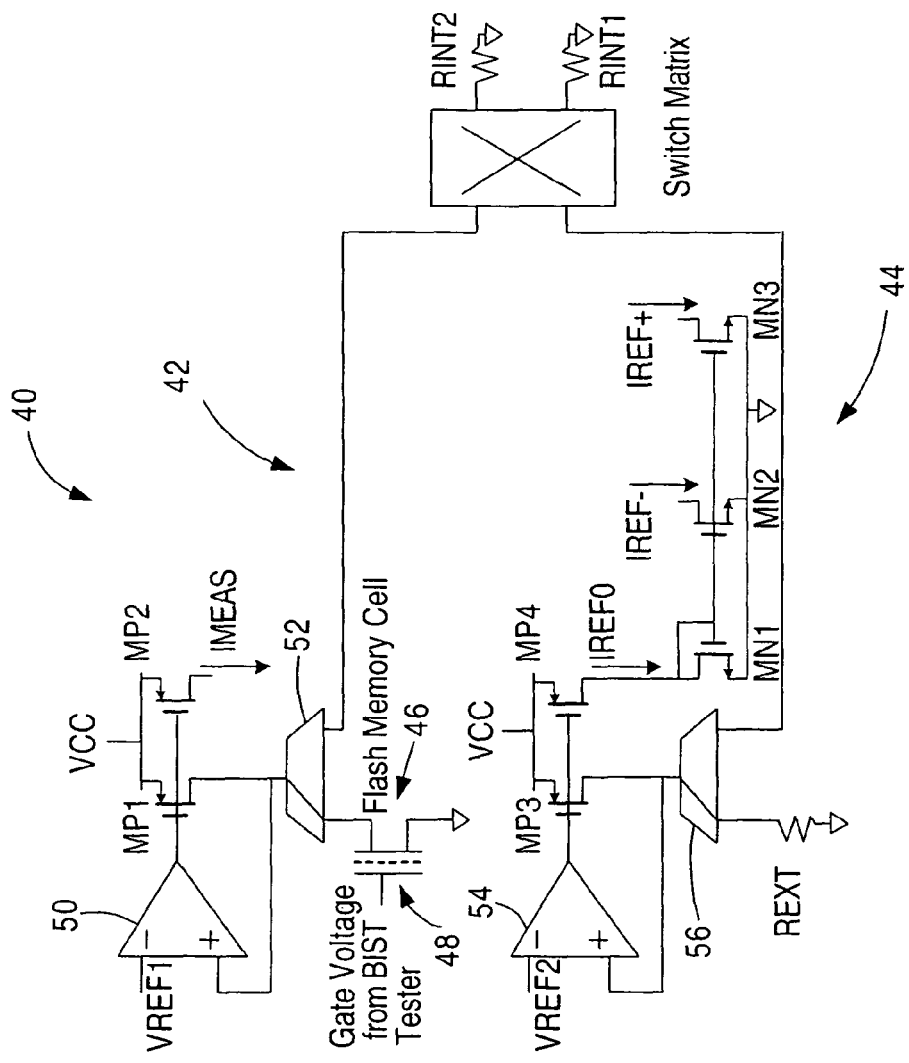
FIG. 2 is a schematic view of the circuit illustrating details of the circuit of FIG. 1, and showing a first mode of operation thereof.

FIG. 2 shows an on-chip circuit 40 illustrating details of the circuit for generating IMEAS, IREF+, and IREF− of FIG. 1. This circuit 40 includes a circuit portion 42, and a circuit portion 44. The circuit portion 42 includes a flash memory cell 46 including transistor 48 the current of which is to be measured, making up the current source 22 of FIG. 1. The gate of the transistor 48 is connected to a BIST tester high voltage pad, which accurately supplies a selected level of voltage thereto. The circuit portion 42 also includes an operational amplifier 50, with voltage VREF1 applied to one input thereof, and having the other input connected to the drain of the transistor 48 of cell 46 through a multiplexer 52. The output of the operational amplifier 50 is connected to the gates of p-type transistors MP1, MP2 in turn connected in parallel to a voltage supply VCC. The drain of the transistor 48 is also connected through multiplexer 52 to p-type transistor MP1, so that the current through the cell 46 is indicated by the current IMEAS of the current source 22 of FIG. 1.

The circuit portion 44 also includes an operational amplifier 54, with voltage VREF2 applied to one input thereof, and with the other input connected through multiplexer 56 to a resistor REXT external to the chip. The output of the operational amplifier 54 is connected to the gates of p-type transistors MP3, MP4 in turn connected in parallel to a voltage supply VCC. The transistor MP4 is connected in series with n-type transistor MN1, which has its gate connected to its drain, and its source connected to ground. Connected in parallel with this transistor MN1 are n-type transistor MN2 and n-type transistor MN3, each of which again has its source connected to ground. In that this state, a current IREF0 is provided through transistor MP4. The transistor MN2 and the transistor MN3 are scaled relative to the transistor MN1 as chosen, so as to provide selected currents IREF− and IREF+ (for the respective current sources 26, 24) based on and varying from IREF0 in a chosen manner. As will be later understood, the accurate generation of currents IREF− and IREF+, based on the accurate generation of current IREF0, is extremely important. This accurate generation can readily be achieved using the resistor REXT external to the chip, rather than an on-chip resistor. The resistance value of an on-chip resistor is difficult to control, because the resistance value thereof is at the mercy of the level of precision which can be achieved during the fabrication thereof. On the other hand, off-chip resistors are fabricated to very accurate resistance values.

The currents IREF− and IREF+ are chosen at levels in accordance with the range in which the measured current is expected to lie. For example, if the current IMEAS passing through the cell 46 is expected to be within the range of 8 μA to 12 μA, IREF− and IREF+ would be selected as 8 μA and 12 μA respectively.

Figure 3:
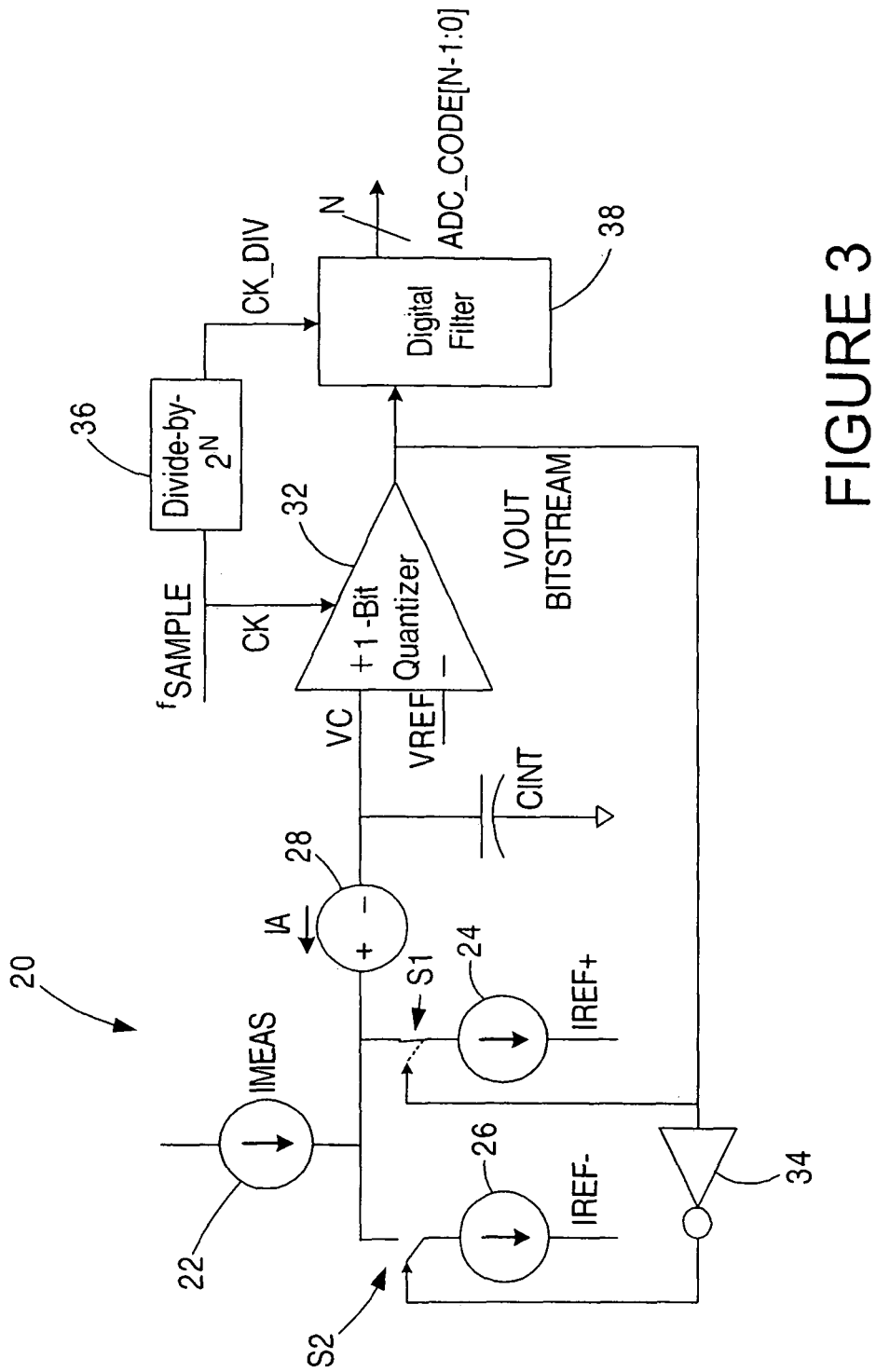
FIGS. 3 and 4 are schematic views similar to that of FIG. 1 showing the circuit in first and second operating conditions.
Figure 4:
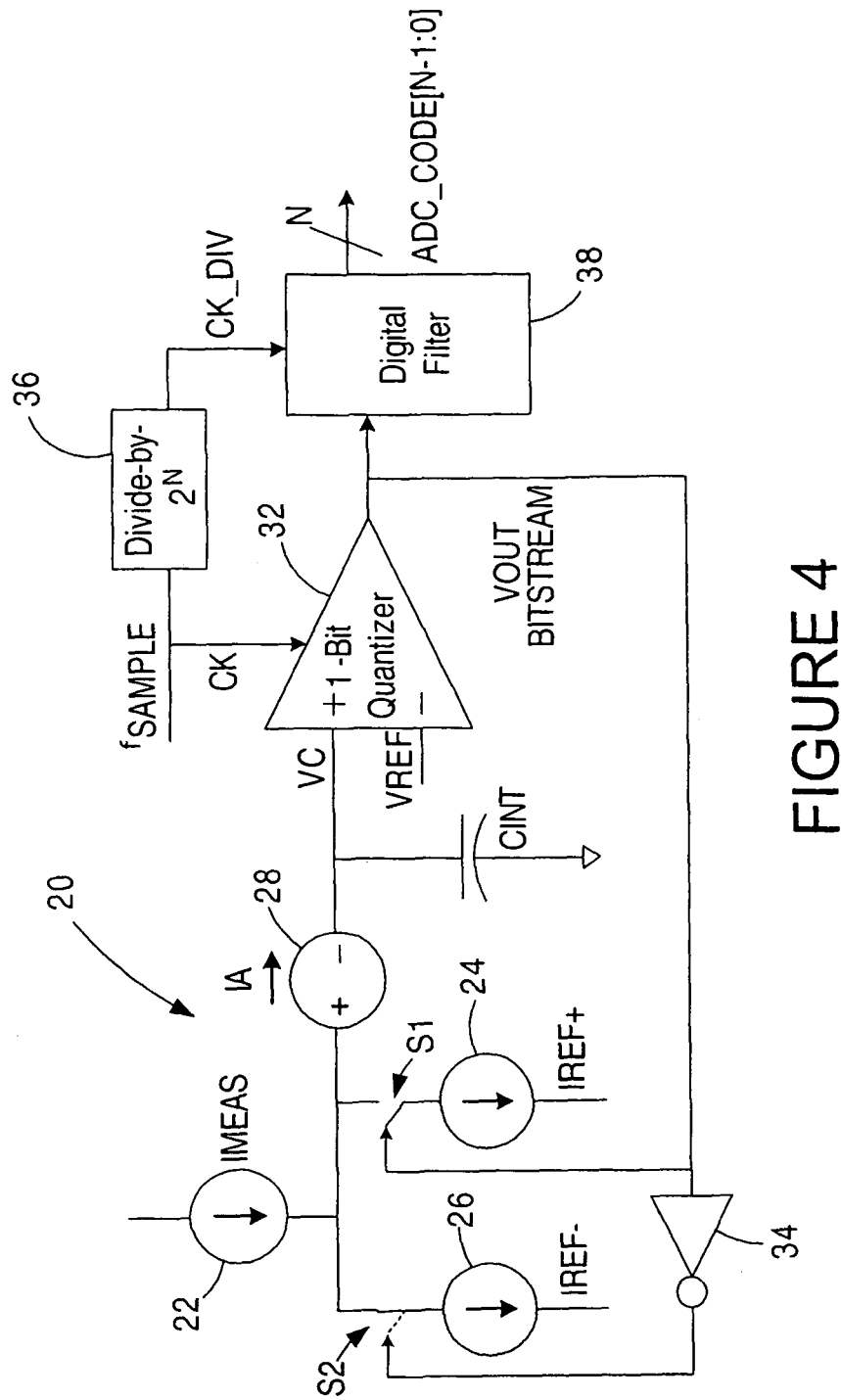

FIG. 3 illustrates the circuit in an operating condition wherein the switch S2 is open while the switch S1 is closed. As set forth above, IREF− and IREF+ are set at 8 μA to 12 μA respectively, and the analog current IMEAS (lying between IREF− and IREF+) is to be measured. The clock VCK is running (FIG. 5A), providing a series of individual voltage pulses. At the initial pulse, the voltage VC applied to the input of the comparator/1-bit quantizer 32 is shown as greater than VREF. With the switch open S2 and the switch S1 closed, the currents IMEAS and IREF+ are combined and provided to the capacitor CINT. With the current IMEAS less than the current IREF+, current IA will flow from the capacitor CINT in the direction toward the connection of currents IMEAS and IREF+ to make up the difference in these currents. In this embodiment, this current is indicated as −2 μA (FIG. 5B). This flow of current from the capacitor CINT lowers the voltage VC applied to the input of the comparator/1-bit quantizer 32 (FIG. 5C). At the next clock pulse, the comparison of the voltage VC and VREF is sampled, and as will be seen (FIG. 5C), the voltage VC has dropped below the voltage VREF, causing the output of the comparator/1-bit quantizer 32 to drop to 0 (FIG. 5D). With reference to FIG. 4, this output 0 is applied to the switch S1, opening the switch S1. This value of voltage 0 is also inverted by inverter 34 to value 1, closing the switch S2. With the switch S2 closed and the switch open S1, the current IMEAS and IREF− are combined and provided to the capacitor CINT. With the current IMEAS greater than the current IREF−, the excess current of IMEAS as compared to IREF− will flow to the capacitor CINT in the direction from the connection of currents IMEAS and IREF− to the capacitor CINT. In this embodiment, this current IA is indicated as +2 μA (FIG. 5B). This flow of current to the capacitor CINT increases the voltage VC applied to the comparator/1-bit quantizer 32. At the next clock pulse, the comparison of the voltage VC and VREF is sampled, and as will be seen, the voltage VC has risen above the voltage VREF (FIG. 5), causing the output of the comparator/1-bit quantizer 32 to rise to 1. This output 1 is applied to the switch S1, closing the switch S1. This value of voltage 1 is also inverted by inverter 34 to value 0, opening the switch S2. This causes the state of the circuit 20 to revert to that as shown in FIG. 3.

The operation thus far described is repeated to provide 64 successive bits of information, as output from the comparator/1-bit quantizer 32 to the digital filter 38. It will be seen that the bits will take the form 10101010 . . . , i.e., 32 1 bits and 32

0 bits. With the storing of these 64 successive bits a full clock divide period is reached, and ADC signal code is output by the digital filter 38, in the form 100000=32 1 bits. The current IMEAS can be quantified for a full clock divide period in accordance with the following:

$$IMEAS = \text{count of 1 bits}/2^N \text{ times(difference between IREF+ and IREF-) plus IREF-}$$

Or in this situation $$IMEAS = 32/64 \times 4 \mu A + 8 \mu A = 10 \mu A.$$

A reasonable expectation is to be able to read the measured current to an accuracy of ±0.5 µA. With the difference between IREF+ and IREF− being 4 µA, and with $2^N=64$, 4 µA/64=less than 0.1 µA, well less than the tolerance of 0.5 µA set as a goal.

Figure 6:
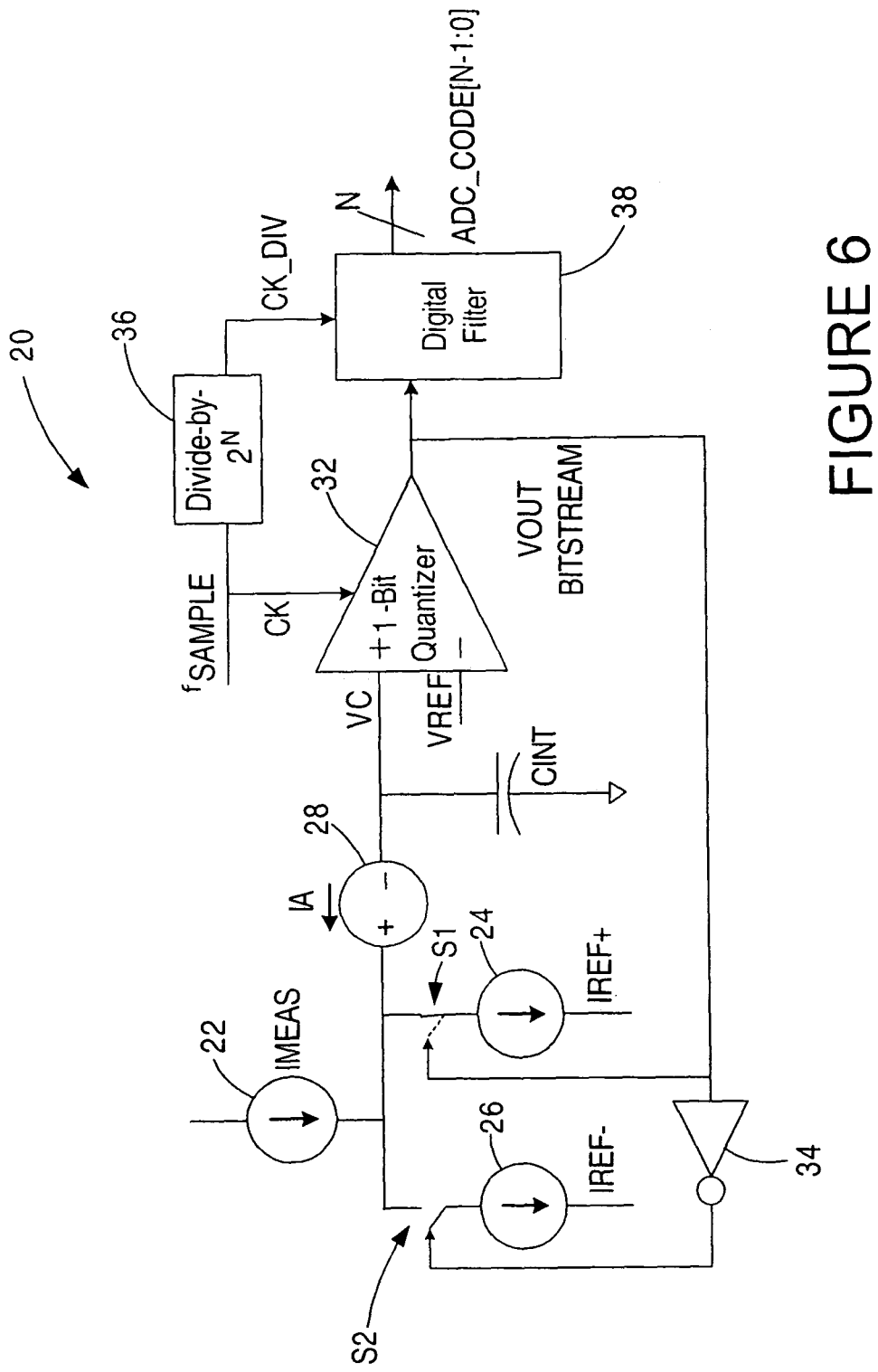
FIGS. 6 and 7 are schematic views similar to that of FIG. 1 again showing the circuit in first and second operating conditions.
Figure 7:
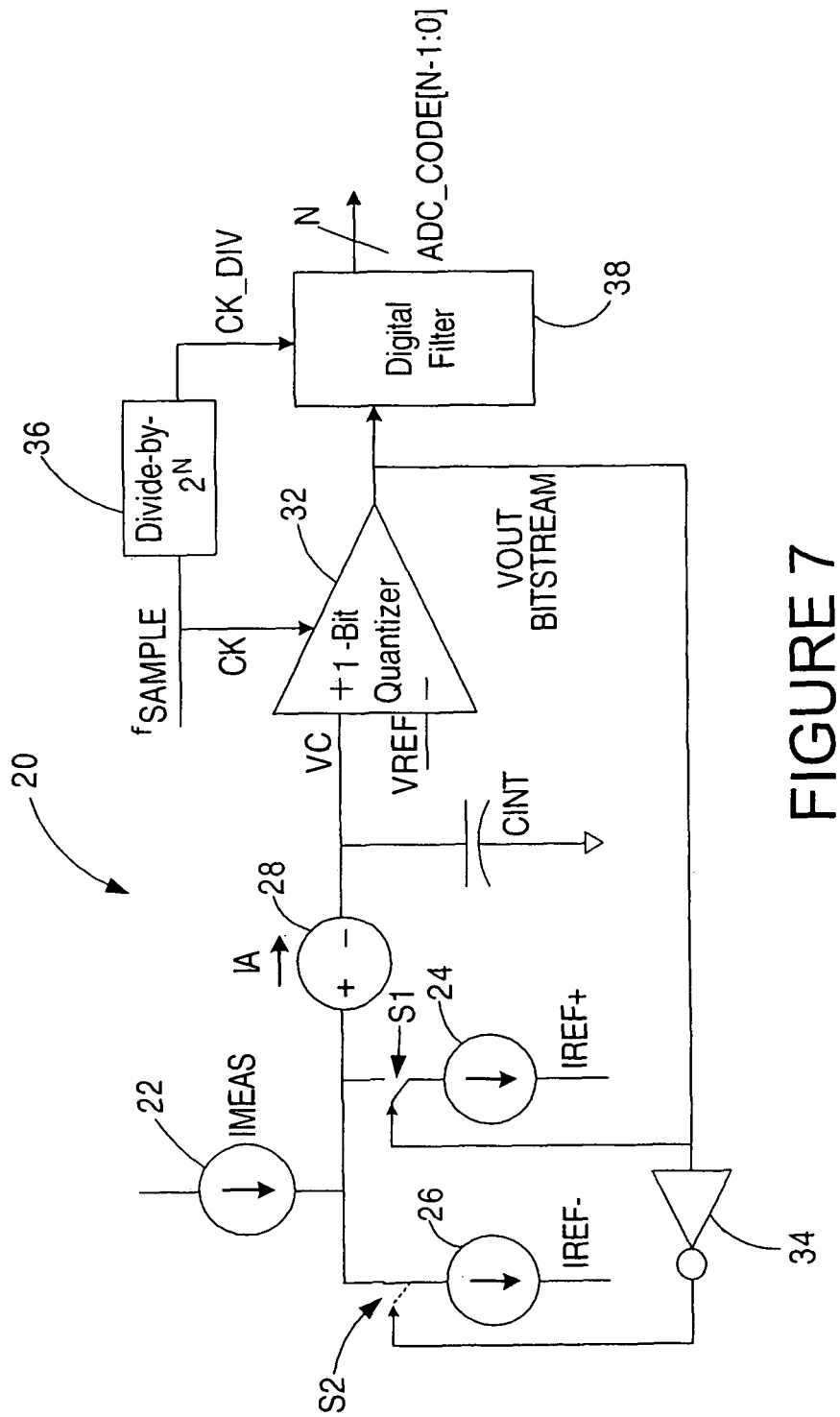
Figure 8:
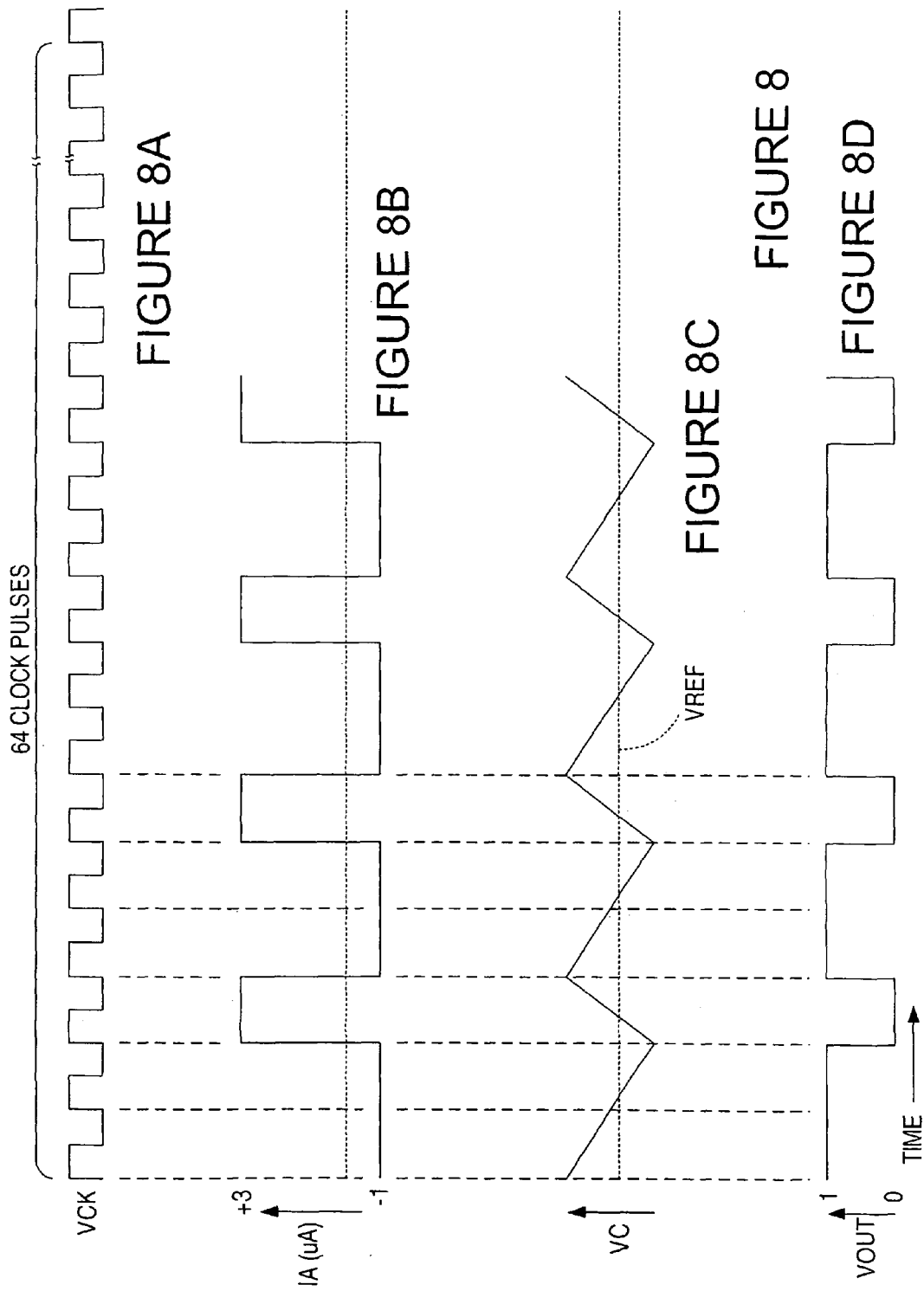
FIG. 8 is a timing diagram illustrating the operation of the circuit of FIGS. 6 and 7 in measuring a second current level.

FIG. 6 illustrates the circuit 20 in an operating condition wherein again the switch S2 is open while the switch S1 is closed. IREF− and IREF+ are again at 8 µA to 12 µA respectively, and the current IMEAS (lying between IREF− and IREF+) is to be measured. The clock VCK is running (FIG. 8A), providing a series of individual voltage pulses. At the initial pulse, the voltage VC applied to the comparator/1-bit quantizer 32 is shown as greater than VREF (FIG. 8C). With the switch open S2 and the switch S1 closed, the currents IMEAS and IREF+ are combined and provided to the capacitor CINT. With the current IMEAS less than the current IREF+, current IA will flow from the capacitor CINT in the direction toward the connection of currents IMEAS and IREF+ to make up the difference in these currents. In this embodiment, this current IA is indicated as −1 µA (FIG. 8B). This flow of current from the capacitor lowers the voltage VC applied to the comparator/1-bit quantizer 32. At the next clock pulse, the comparison of the voltage VC and VREF is sampled, and as will be seen (FIG. 8C), the voltage VC is still above the voltage VREF, causing the output of the comparator/1-bit quantizer 32 to be 1, so that the state of the circuit 20 is maintained as shown in FIG. 6. At the next clock pulse, the comparison of the voltage VC and VREF is sampled, and as will be seen (FIG. 8C), the voltage VC has dropped below the voltage VREF, causing the output of the comparator/1-bit quantizer 32 to drop to 0 (FIG. 8D). With reference to FIG. 7, this output 0 is applied to the switch S1, opening the switch S1. This value of voltage 0 is also inverted by inverter 34 to value 1, closing the switch S2. With the switch S2 closed and the switch S1 open, the current IMEAS and IREF− are combined and provided to the capacitor CINT. With the current IMEAS greater than the current IREF−, the excess current of IMEAS as compared to IREF− will flow to the capacitor CINT in the direction from the connection of currents IMEAS and IREF− to the capacitor CINT. In this embodiment, this current IA is indicated as +3 µA (FIG. 8B). This flow of current to the capacitor increases the voltage VC applied to the comparator/1-bit quantizer. At the next clock pulse, the comparison of the voltage VC and VREF is sampled, and as will be seen, the voltage VC has risen above the voltage VREF, causing the output of the comparator/1-bit quantizer 32 to rise to 1. This output 1 is applied to the switch S1, closing the switch S1. This value of voltage 1 is also inverted by inverter 34 to value 0, opening the switch S2. This causes the state of the circuit 20 to revert to that as shown in FIG. 6.

The operation thus far described is repeated to provide 64 successive bits of information, as output from the comparator/1-bit quantizer 32 to the digital filter 38. It will be seen that the bits will take the form 110110110 . . . , i.e., 43 1 bits and 21 0 bits. With the storing of these 64 successive bits a full clock divide period is reached, and ADC signal code is output by the digital filter 38, in the form 101011=43 1 bits. The current IMEAS can be quantified for a full clock divide period in accordance with the following:

$$IMEAS = \text{count of 1 bits}/2^N \text{ times(difference between IREF+ and IREF-) plus IREF-}$$

Or in this situation $$IMEAS = 43/64 \times 4 \mu A + 8 \mu A = 10.7 \mu A$$

Figure 9:
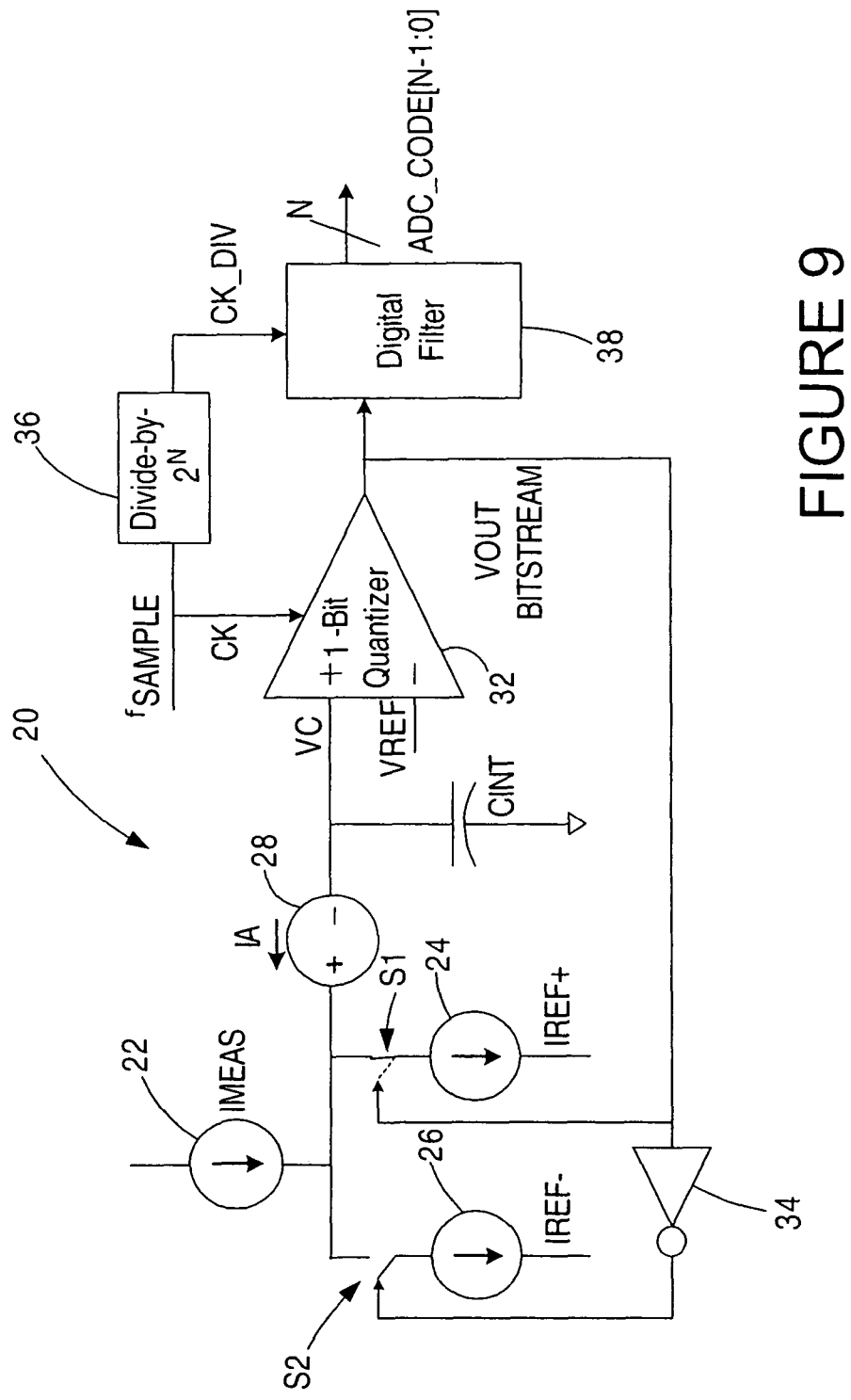
FIGS. 9 and 10 are schematic views similar to that of FIG. 1 again showing the circuit in first and second operating conditions.
Figure 10:
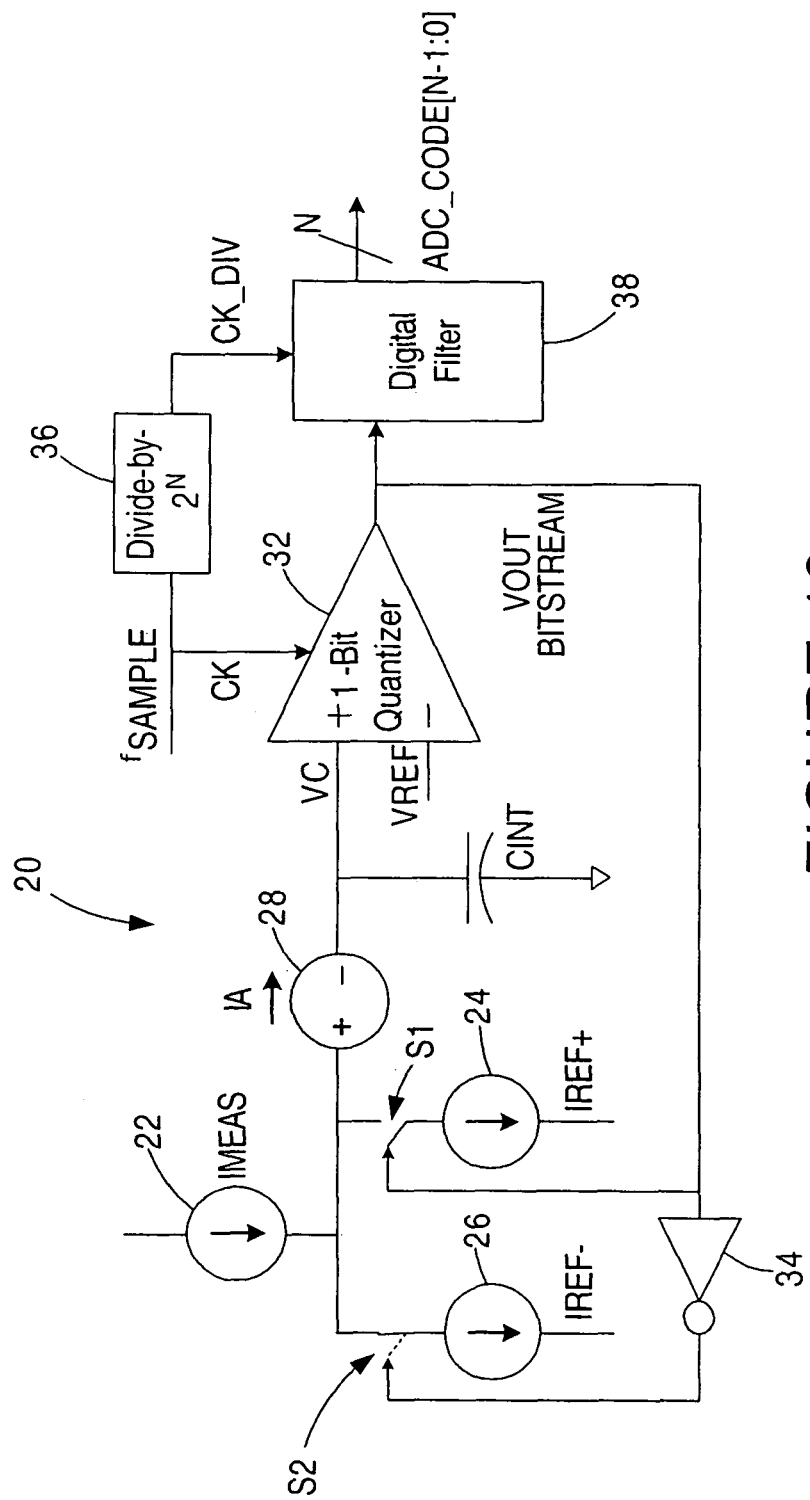
Figure 11:
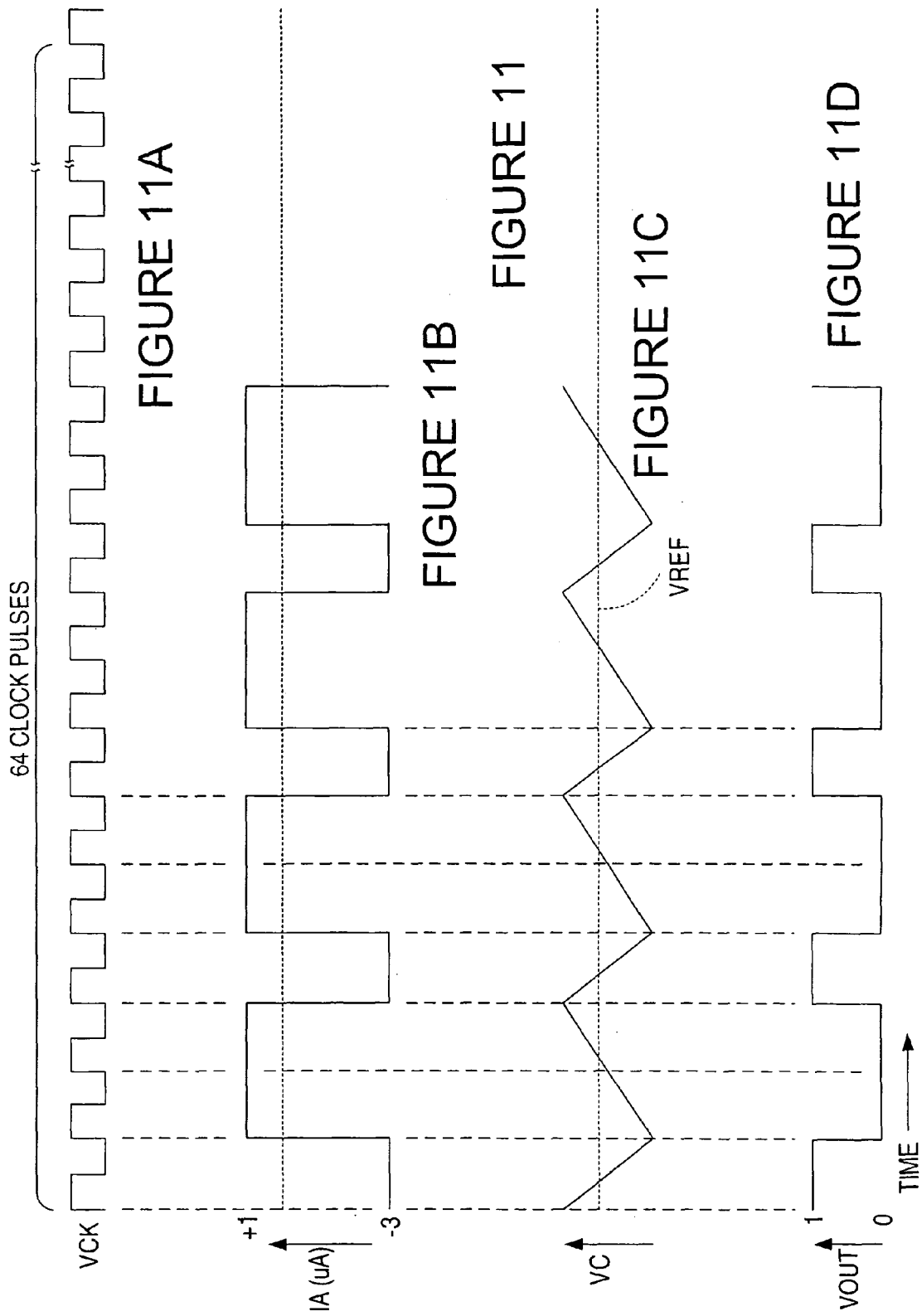
FIG. 11 is a timing diagram illustrating the operation of the circuit of FIGS. 9 and 10 in measuring a third current level.

FIG. 9 illustrates the circuit 20 in an operating condition wherein again the switch S1 is open while the switch S2 is closed. Again, IREF− and IREF+ are at 8 µA to 12 µA respectively, and the current IMEAS (lying between IREF− and IREF+) is to be measured. The clock VCK is running (FIG. 11A), providing a series of individual voltage pulses. At the initial pulse, the voltage VC applied to the comparator/1-bit quantizer 32 is shown as greater than VREF (FIG. 11C). With the switch open S2 and the switch S1 closed, the currents IMEAS and IREF+ are combined and provided to the capacitor CINT. With the current IMEAS less than the current IREF+, current IA will flow from the capacitor CINT in the direction toward the connection of currents IMEAS and IREF+ to make up the difference in these currents. In this embodiment, this current is indicated as −3 µA (FIG. 11B). This flow of current from the capacitor CINT lowers the voltage VC applied to the input of the comparator/1-bit quantizer 32. At the next clock pulse, the comparison of the voltage VC and VREF is sampled, and as will be seen (FIG. 11C), the voltage VC is now below the voltage VREF, causing the output of the comparator/1-bit quantizer 32 to be 0 (FIG. 11D). With reference to FIG. 10, this output 0 is applied to the switch S1, opening the switch S1. This value of voltage 0 is also inverted by inverter 34 to value 1, closing the switch S2. With the switch closed S2 and the switch open S1, the current IMEAS and IREF− are combined and provided to the capacitor CINT. With the current IMEAS greater than the current IREF−, the excess current of IMEAS as compared to IREF− will flow to the capacitor CINT in the direction from the connection of currents IMEAS and IREF− to the capacitor CINT. In this embodiment, this current IA is indicated as +1 µA (FIG. 11B). This flow of current to the capacitor CINT increases the voltage VC applied to the comparator/1-bit quantizer 32. At the next clock pulse, the comparison of the voltage VC and VREF is sampled, and as will be seen, the voltage VC is still below VREF, so that the state of the circuit 20 is maintained as shown in FIG. 10. At the next clock pulse, voltage VC has risen above VREF, causing the output of the comparator/1-bit quantizer 32 to rise to 1. This output 1 is applied to the switch S1, closing the switch S1. This value of voltage 1 is also inverted by inverter 34 to value 0, opening the switch S2. This causes the state of the circuit 20 to revert to that as shown in FIG. 9.

The operation thus far described is repeated to provide 64 successive bits of information, as output from the comparator/1-bit quantizer 32 to the digital filter 38. It will be seen at the bits will take the form 100100100 . . . , i.e., 22 1 bits and 42 0 bits. With the storing of these 64 successive bits a full clock divide period is reached, an ADC signal code is output by the digital filter 38, in the form 0101010=22 1 bits. The current IMEAS can be quantified for a full clock divide period in accordance with the following:

$$IMEAS = \text{count of 1 bits}/2^N \text{ times(difference between IREF+ and IREF-) plus IREF-}$$

Or in this situation $$IMEAS = 22/64 \times 4 \mu A + 8 \mu A = 9.4 \mu A$$

Once such current is known, the cell 46 can be trimmed to establish a desired accurate current level therethrough, so that that cell 46 can be used as a reference cell in reading the states of flash memory cells in an array.

The averaging capability of the circuit twenty is important in filtering out AC noise that can be expected to be generated from the gate voltage of the transistor 48 of the flash memory cell 46 and the external resistor REXT as well as ground bounce. The circuit 20 also has the capability of noise-shaping, which moves the quantization noise error of the quantizer to a higher frequency spectrum while retaining the desired lower frequency signal. With the usage of the digital filter 38, a large portion of the quantization noise error at the higher frequency spectrum can be removed, leaving the desired signal information accurately represented in the ADC digital code.

Figure 12:
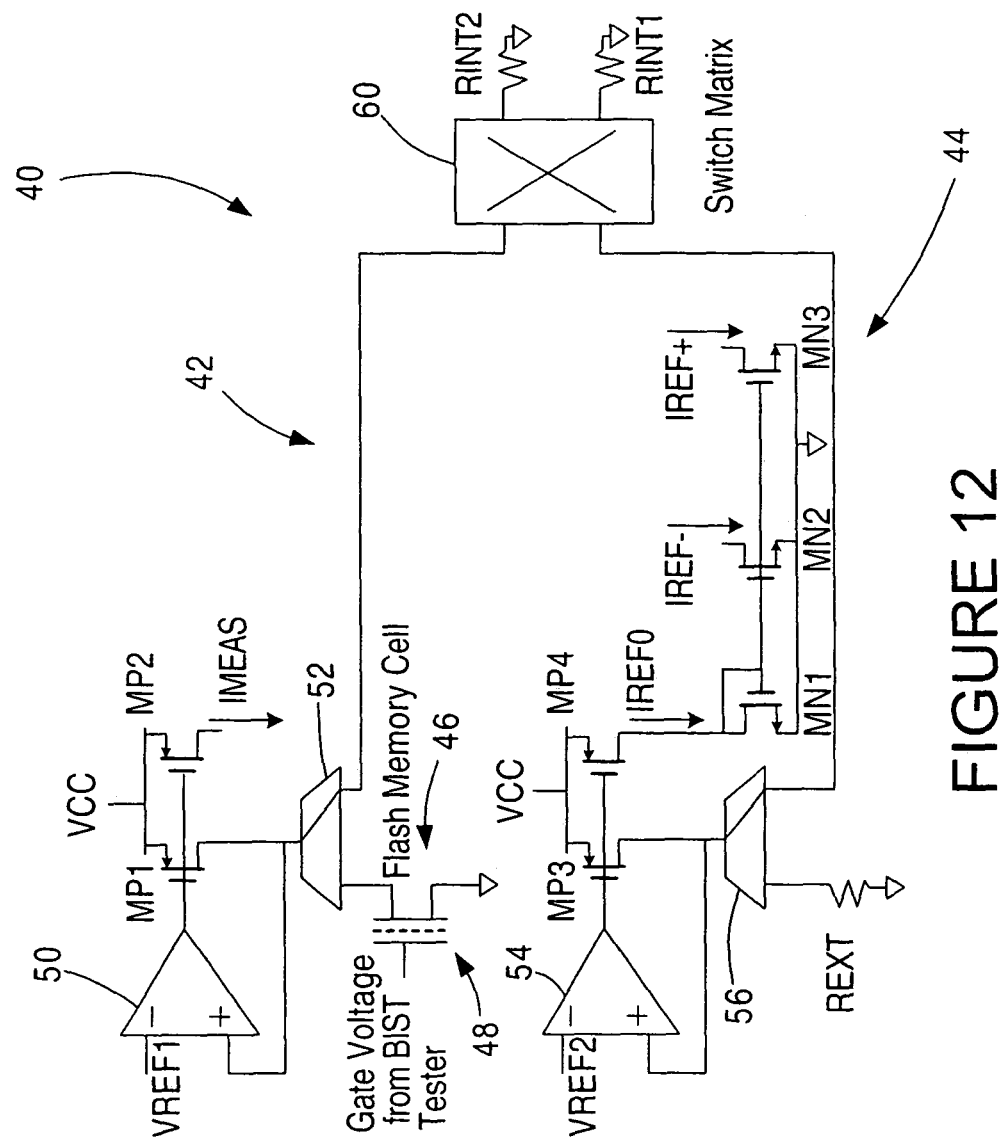
FIG. 12 is a circuit view similar to that of FIG. 2, and showing a second mode of operation thereof.

As will be understood, the process for forming the transistors MP1, MP2, MP3, MP4, MN1, MN2, MN3, as well as the input devices of the operational amplifiers of FIG. 2, likely results in mismatches of for example threshold voltage, channel length, channel width, and transconductance, which can result in a DC offset error in the A/D conversion by the quantizer 32. A method of calibration to reduce this error is now described. In order to achieve this, and with reference to FIG. 12, ideally, currents IMEAS and IREF0 are to be provided as equal in magnitude, which in turn would require inclusion of two resistors of equal resistance values through which these respective currents pass. While two such resistors with equal resistance values can be provided externally of the chip, this approach is quite expensive. The present approach avoids this expense by providing on-chip, i.e., internal resistors RINT1, RINT2 through which (with multiplexers 52, 56 set as shown) the currents IMEAS and IREF0 flow. However, these resistors RINT1, RINT2 have a mismatch problem similar to that described above with regard to the transistors MP1, MP2, MP3, MP4, MN1, MN2, MN3. That is, even though the resistors RINT1, RINT2 are intended to have equal resistance values, these resistance values may vary in the formed resistors.

In order to deal with this problem, a switch matrix 60 is included, which may be set to simultaneously connect the resistor RINT1 with the circuit 42 so that current IMEAS passes through the resistor RINT1, and connect the resistor RINT2 with the circuit 44 so that the current IREF0 passes through the resistor RINT2. The switch matrix 60 may also be set to simultaneously connect the resistor RINT2 with the circuit 42 so that current IMEAS passes through the resistor RINT2, and connect the resistor RINT1 with the circuit 44 so that the current IREF0 passes through the resistor RINT1.

Figure 13:
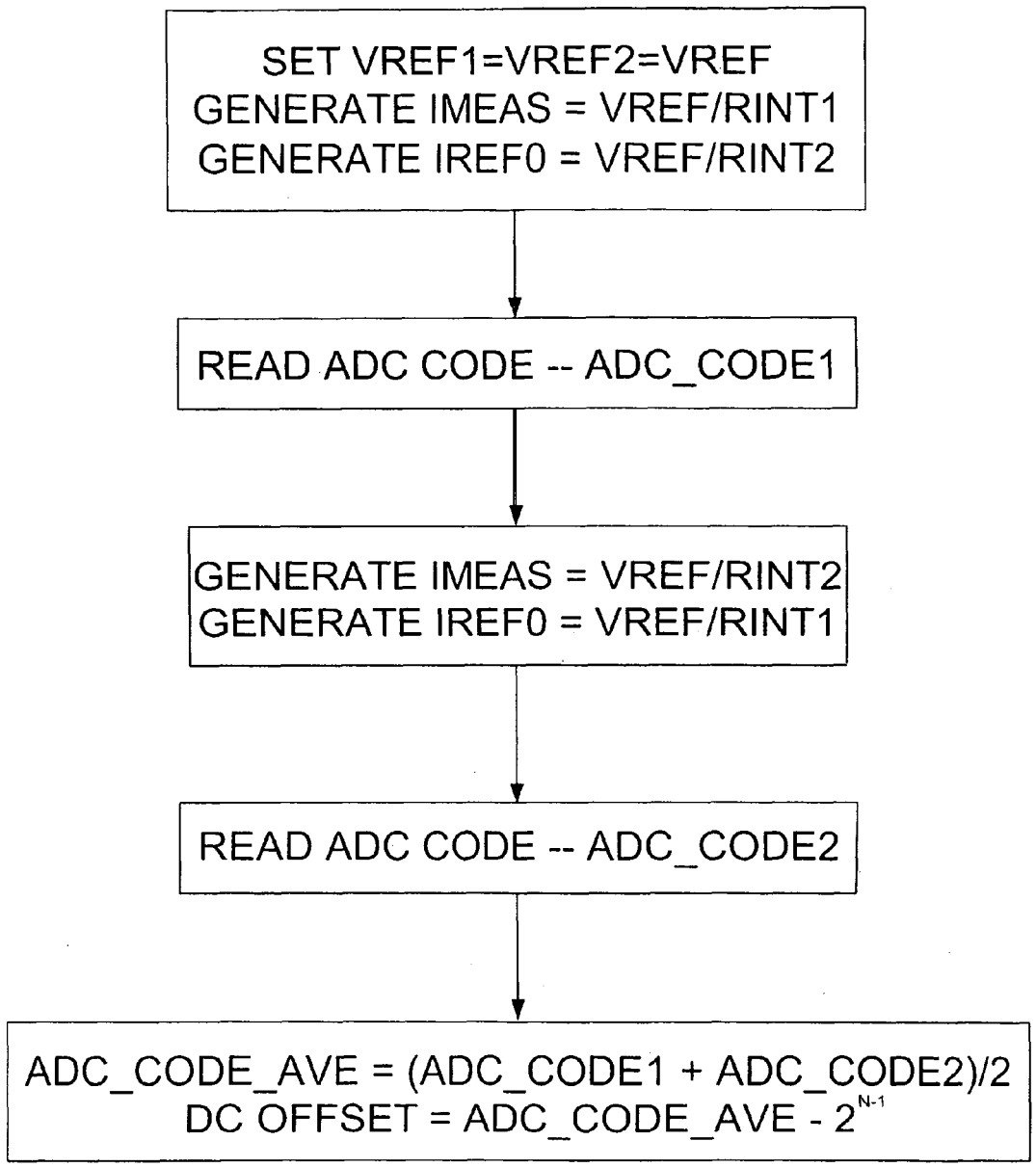
FIG. 13 is a flow diagram describing the second mode of operation of the circuit of FIG. 12.

In practicing this approach, and with reference to FIG. 13, VREF1 is set to equal to VREF2, i.e., VREF1=VREF2=VREF. With the switch matrix 60 set so that current IMEAS passes through the resistor RINT1, such current IMEAS is generated. With the switch matrix 60 in this state, current IREF0 passes through the resistor RINT2, and such current IREF0 is generated. These currents IMEAS and IREF0 are measured against each other, and the ADC output code is read, yielding ADC_CODE1. This code should be at midpoint of the digital code, i.e., 100000. Any deviation from this midpoint would be a DC offset.

The switch matrix 60 is then switched to its other state so that when so set current IMEAS passes through the resistor RINT2, and such current IMEAS is generated. With the switch matrix 60 in this state, current IREF0 passes through the resistor RINT1, and such current IREF0 is generated. These currents IMEAS and IREF0 are measured against each other, and the ADC output code is read, yielding ADC_CODE2. Again, this code should be at midpoint of the digital code, i.e., 100000. Any deviation from this midpoint would be a DC offset.

Then, the overall DC offset is calculated as follows:

$$ADC\_CODE\_AVE=(ADC\_CODE1+ADC\_CODE2)/2$$

DC offset it is then given as:

$$ADC\_CODE\_AVE-2^{N}-1$$

with the subtraction of $2^{N}-1$ bringing the value thereof to the midpoint of the digital code.

For small mismatches in the resistors RINT1, RINT2, the error will be significantly reduced in accordance with the approach of the step. With the resistor mismatch taken care of in that step, any mismatch among the transistors MP1, MP2, MP3, MP4, MN1, MN2, MN3 will be represented in that step by the DC OFFSET.

The present approach for measuring current of a memory cell achieves highly accurate measurement of that current. In addition, the approach is low-cost and requires minimal time. Furthermore, accurate reading of DC offset due to device mismatches is also achieved at low cost and in minimal time.

The foregoing description of the embodiment of the invention has been presented for purposes of illustration and description. It is not intended to be exhaustive or to limit the invention to the precise form disclosed. Other modifications or variations are possible in light of the above teachings.

The embodiment was chosen and described to provide the best illustration of the principles of the invention and its practical application to thereby enable one of ordinary skill of the art to utilize the invention in various embodiments and with various modifications as are suited to the particular use contemplated. All such modifications and variations are within the scope of the invention as determined by the appended claims when interpreted in accordance with the breadth to which they are fairly, legally and equitably entitled.

What is claimed is:

1. A method of providing an output based on the value of a current comprising:
   providing a current in a transistor of a flash memory cell by applying a first voltage to the gate of the transistor, the voltage being provided by a built-in self test (BIST) voltage pad;
   providing voltage based on the current;
   comparing, in a comparator, the provided voltage with a reference voltage;
   providing an output the value of which is based on the comparison of the provided voltage with the reference voltage, wherein the output comprises a digital voltage output;
   sampling the output of the comparator at each pulse of a clock until a full clock divide period is reached;
   storing the digital voltage output in a digital filter for a duration of time; and
   filtering noise from the comparator in the digital filter over the duration of time,
   wherein the comparator comprises a quantizer, and wherein filtering noise in the digital filter comprises performing noise-shaping to move a quantization noise error of the quantizer to a higher frequency spectrum.

2. The method of claim 1 and further comprising first, second and third current sources, and further comprising providing the current by selecting either a combination of the first and second current sources, or selecting a combination of the first and third current sources.

3. The method of claim 2 wherein the selection of either the combination of the first and second current sources or the combination of the first and third current sources is based on the value of the digital voltage output.

4. The method of claim 3 wherein the first current source provides a level of current between the level of current of the second current source and the level of current of the third current source.

5. The method of claim 1 wherein the current is provided to a capacitor to provide voltage on the capacitor, and wherein the voltage provided to the capacitor is compared with the reference voltage.

6. The method of claim 1, further comprising removing a portion of the quantization noise error at the higher frequency in the digital filter.

7. A method of measuring the current of a first current source comprising:
   (a) providing second and third current sources;
   (b) combining the current of the first current source with the current of the second current source;
   (c) applying the combined current of the first current source and second current source to provide voltage;
   (d) comparing, in a comparator, the provided voltage with a reference voltage;
   (e) providing a digital output based on the comparison of the provided voltage with the reference voltage;
   (f) sampling an output of the comparator at each pulse of a clock until a full clock divide period is reached;
   (g) undertaking steps (b), (c), (d), (e), and (f) when the digital output is of a first value;
   (h) when the digital output is of a second value different from the first value,
   (i) combining the current of the first current source with the current of the third current source;
   (j) storing the digital output provided in step (e) for a duration of time; and
   (k) filtering noise from the comparator in a digital filter over the duration of time,
   wherein the comparator comprises a quantizer, and wherein filtering noise in the digital filter comprises performing noise-shaping to move a quantization noise error of the quantizer to a higher frequency spectrum.

8. The method of claim 7 and further comprising:
   (l) applying the combined current of the first current source and third current source to provide another voltage;
   (m) comparing said another provided voltage with the reference voltage; and
   (n) providing a digital output based on the comparison of said another provided voltage with the reference voltage.

9. The method of claim 8 and further comprising:
   (o) again undertaking steps (b), (c), (d) and (e) when the digital output is of the first value;
   (p) again undertaking steps (i), (l), (m), and (n) when the digital output is of the second value different from the first value.

10. The method of claim 9 wherein the combined currents are applied to a capacitor to provide voltage on the capacitor, and wherein the provided voltage on the capacitor is compared with the reference voltage.

11. The method of claim 7 wherein each of the first, second and third current sources provide substantially constant currents.

12. The method of claim 7 wherein the first current source provides a level of current between the level of current of the second current source and the level of current of the third current source.

13. The method of claim 9 wherein each digital output is a digital voltage output.

14. The method of claim 7, further wherein a portion of the quantization noise error at the higher frequency is removed in the digital filter.

* * * * *